United States Patent
Padilla et al.

(10) Patent No.: US 9,917,028 B2
(45) Date of Patent: Mar. 13, 2018

(54) METHOD AND APPARATUS FOR MAINTAINING OPERATIONAL TEMPERATURE OF AN INTEGRATED CIRCUIT

(75) Inventors: Toby Mark Padilla, Lakewood, CO (US); Martin Verwiebe, Broomfield, CO (US); Ryan Neal Milbrandt, Lakewood, CO (US); Randall Dennis Bousfield, Arvada, CO (US)

(73) Assignee: ASSA ABLOY AB (SE)

( * ) Notice: Subject to any disclaimer, the term of this patent is extended or adjusted under 35 U.S.C. 154(b) by 1241 days.

(21) Appl. No.: 13/607,981

(22) Filed: Sep. 10, 2012

(65) Prior Publication Data

US 2013/0062331 A1    Mar. 14, 2013

Related U.S. Application Data

(60) Provisional application No. 61/532,961, filed on Sep. 9, 2011.

(51) Int. Cl.
  *H05B 3/00* (2006.01)
  *G01R 31/00* (2006.01)
  *H01L 23/34* (2006.01)

(52) U.S. Cl.
  CPC .... *H01L 23/345* (2013.01); *H01L 2924/0002* (2013.01)

(58) Field of Classification Search
  CPC ........... H01L 23/345; H01L 2924/0002; H01L 2924/00
  USPC ...................................... 219/209; 324/750.03
  See application file for complete search history.

(56) References Cited

U.S. PATENT DOCUMENTS

| | | |
|---|---|---|
| 5,089,876 A | 2/1992 | Ishioka |
| 5,396,403 A | 3/1995 | Patel |
| 5,640,746 A * | 6/1997 | Knecht et al. ............... 29/25.35 |
| 5,917,272 A * | 6/1999 | Clark et al. ................... 310/343 |
| 6,042,010 A | 3/2000 | Kanayama et al. |
| 6,058,481 A | 5/2000 | Kowalski |
| 6,330,145 B1 | 12/2001 | Lepert et al. |
| 6,337,619 B1 | 1/2002 | Kowalski et al. |
| 6,494,367 B1 | 12/2002 | Zacharias |
| 6,650,227 B1 | 11/2003 | Bradin |
| 6,775,169 B1 | 8/2004 | d'Acoz et al. |
| 7,088,032 B2 * | 8/2006 | Oita et al. ..................... 310/343 |
| 7,124,943 B2 | 10/2006 | Quan et al. |

(Continued)

FOREIGN PATENT DOCUMENTS

| | | |
|---|---|---|
| CN | 201867439 | 6/2011 |
| WO | WO 2009/106305 | 9/2009 |

OTHER PUBLICATIONS

European Extended Search Report for European Patent Application No. 12183704.1, dated Nov. 7, 2017, 11 pages.

(Continued)

*Primary Examiner* — Sang Y Paik
(74) *Attorney, Agent, or Firm* — Sheridan Ross P.C.

(57) ABSTRACT

A temperature-controlled integrated circuit configured with a secure data processing element, and method of manufacture of same, is disclosed. Specifically, the temperature-controlled integrated circuit, comprising a secure data processing element operable within a nominal operating range, is configured with a heat-transfer element which allows the secure data processing element to operate in an extended operating range.

13 Claims, 5 Drawing Sheets

(56) References Cited

U.S. PATENT DOCUMENTS

| | | | |
|---|---|---|---|
| 7,175,075 B2 | 2/2007 | Magee et al. | |
| 7,438,220 B2 | 10/2008 | Magee et al. | |
| 7,514,852 B2 * | 4/2009 | Kasahara et al. | 310/343 |
| 7,782,147 B2 * | 8/2010 | Anderson et al. | 331/69 |
| 2004/0007324 A1 | 1/2004 | Henn et al. | |
| 2007/0001008 A1 | 1/2007 | Steffen | |

OTHER PUBLICATIONS

"Combination/Transition Readers," Specifications, HID Global, 2007, 2 pages.

"Infineon Adds Security' and Convenience to SIM Cards for NFC Applications," Technology Media, Nov. 13, 2007, retrieved from www.infineon.com/cms/en/corporate/press/news/releases/2007/INFAIM200711-015, 2 pages.

"SLE 88 Solid Flash Family," Infineon, 2012, retrieved from www.infineon.com/cms/en/product/chip-card-and-security-ics/security-controller-cont . . . , 2 pages.

"Solid Flash for Reliable High Security Smart Cards," Whitepaper, Apr. 2012, retrieved from www.infeneon.com/solidflash, 12 pages.

\* cited by examiner

METHOD AND APPARATUS FOR MAINTAINING OPERATIONAL TEMPERATURE OF AN INTEGRATED CIRCUIT

CROSS REFERENCE TO RELATED APPLICATION

The present application claims the benefit of U.S. Provisional Application Ser. No. 61/532,961, filed Sep. 9, 2011, entitled "METHOD AND APPARATUS FOR MAINTAINING OPERATIONAL TEMPERATURE OF AN INTEGRATED CIRCUIT", which is incorporated herein by this reference in its entirety.

FIELD OF THE DISCLOSURE

The present disclosure is generally directed toward a temperature-controlled integrated circuit and specifically directed toward a temperature-controlled integrated circuit comprising a secure data processing element which operates in an extended temperature range.

BACKGROUND

Secure access systems are used in a wide array of settings spanning industrial, medical, military, retail and financial. In addition to controlling access, the systems may also monitor and record access, track user behavior and detect access irregularities such as fraudulent access cards. Typical secure access systems employ a fixed control reader device and a user access card, commonly communicating through a magnetic stripe embedded on the access card or via radio frequency (RF). In RF identification (RFID) systems, an access card located within a given proximity to a card reader communicates through electromagnetic waves in the RF band. Secure cards include a secure data processing component to authenticate a valid user. Secure access systems employing RFID is generally discussed in U.S. Patent Application Publication No. 2007/0001008, the entire contents of which are hereby incorporated by reference.

Access control readers used in secure access systems are typically limited in operating environments to a nominal temperature band, commonly above 0 degree Celsius. Such an operating limitation can significantly decrease the utility of secure access systems, in particular those mounted outdoors in cold-weather climates. Any expansion of the operating envelope of such systems must be cost-efficient, simple to implement, reliable, and secure, given the highly cost-competitive nature of secure access systems and access readers/access card systems.

One example of a system intended to expand the operating temperature range of card readers is disclosed in U.S. Pat. No. 6,042,010, the entire contents of which are hereby incorporated by reference. The '010 patent employs specialized structure on a card reader to prevent foreign material from invading the circuit unit. A magnetic head holding means protrudes from the card reader main unit to the inside of the card insertion slot cover. Although seemingly effective in some situations, such as during ice build-up on a magnetic card reader system, the system is ineffective in application to more modern RFID systems.

U.S. Pat. No. 7,438,220 discloses a system to control the temperature of a secure system. The entire contents of the '220 patent are hereby incorporated by reference. The '220 publication describes an automated banking machine with a card reader involving a complex temperature control system for the reader. The '220 device is impractical for adaptation to most access control systems and is not particularly cost-effective.

SUMMARY

It is, therefore, one aspect of the present disclosure to provide a temperature-controlled integrated circuit comprising a heat-transfer element which allows a secure data processing element to operate in an extended operating range. It is also an aspect of the present disclosure to provide easy-to-implement and cost-effective methods of constructing and using a temperature-controlled integrated circuit comprising a heat-transfer element.

The temperature-controlled integrated circuit is fitted with a heat-transfer element positioned on a common substrate with the secure element. The heat-transfer element is configured to transfer thermal energy, such as heat, to the secure element, thereby allowing the secure element to operate at a lower temperature than its nominal operating temperature range would predict. The heat-transfer element, such as a surface mount resistor, is configured to generate heat as prompted by any of several events. For example, heat may be generated after an atmospheric temperature is sensed below the nominal lowest operating temperature, as measured on the device itself or adjacent the device, or due to a state of communication between the secure element and a general purpose processor (such as a lack of communication or a degradation in communication).

The present disclosure will be further understood from the drawings and the following detailed description. Although this description sets forth specific details, it is understood that certain embodiments of the invention may be practiced without these specific details.

BRIEF DESCRIPTION OF THE DRAWINGS

The accompanying drawings, which are incorporated in and constitute a part of the specification, illustrate embodiments of the disclosure and together with the general description of the disclosure given above and the detailed description of the drawings given below, serve to explain the principles of the disclosures.

It should be understood that the drawings are not necessarily to scale. In certain instances, details that are not necessary for an understanding of the disclosure or that render other details difficult to perceive may have been omitted. It should be understood, of course, that the disclosure is not necessarily limited to the particular embodiments illustrated herein.

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. Preferred embodiments are described to illustrate the present invention, not to limit its scope, which is defined by the claims. Like elements in various embodiments are commonly referred to with like reference numerals. It being understood that various changes may be made in the function and arrangement of elements without departing from the spirit and scope of the appended claims.

Referring now to FIGS. 1-5, representations and configurations of the device, methods of manufacture of the device, and methods of use of the device are shown. Although embodiments of the present disclosure will be described in connection with an access control reader device, those of skill in the art will appreciate that the features disclosed herein may be applied to create temperature-controlled integrated circuits for other applications.

Figure 1A:
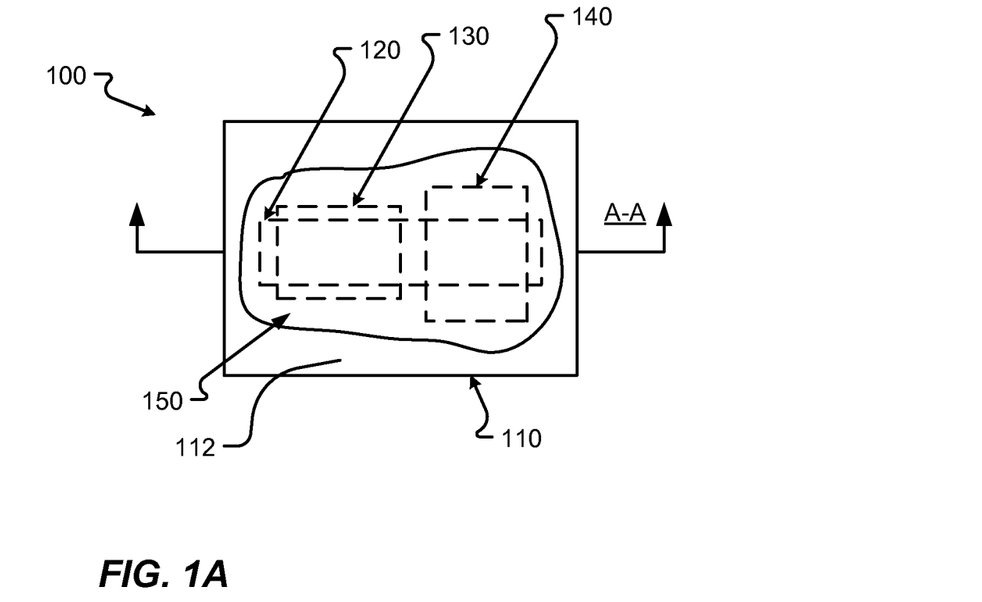
FIG. 1A is a top-view of a temperature-controlled integrated circuit in accordance with at least some embodiments of the present disclosure.
Figure 1B:
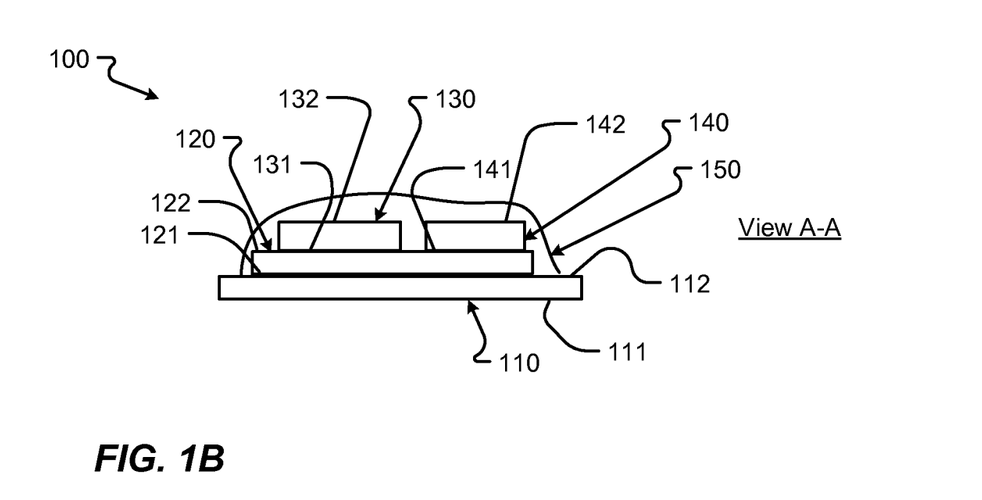
FIG. 1B is a cross-sectional side-view of a temperature-controlled integrated circuit in accordance with at least some embodiments of the present disclosure.

In regard to FIGS. 1A-B, corresponding top and cross-sectional side views of the device 100 are provided. FIG. 1A is a top-view of the temperature-controlled integrated circuit device 100 and FIG. 1B is the corresponding cross-sectional side view along section line A-A. A temperature-controlled integrated circuit device 100 and components thereof will be described in accordance with at least some embodiments of the present disclosure. It should be appreciated that the term temperature-controlled integrated circuit device, integrated-circuit ("IC") device, IC device or device as used herein includes a completed temperature-controlled integrated circuit device or any intermediate temperature-controlled integrated circuit device (e.g., those not including power hook-ups). Thus, the embodiments depicted in FIGS. 1A-B, while showing a temperature-controlled integrated circuit device without power hook-ups and without engagement with a general purpose micro-processor, for example, can be referred to as a temperature-controlled integrated circuit device without departing from the scope of the present disclosure.

FIGS. 1A-B depict a first example of a temperature-controlled integrated circuit device 100 having a substrate 110, a secure element 130, a heat-transfer element 140, a conductive element 120, and potting compound 150. The substrate 110 has a lower surface 111 and upper surface 112. The conductive element 120 has a lower surface 121 and upper surface 122. Similarly, the secure element 130 has a lower surface 131 and upper surface 132, and the heat-transfer element 140 has a lower surface 141 and upper surface 142. The conductive element 120 is disposed on the substrate 110, such that the upper surface 112 of the substrate 110 engages the lower surface 121 of the conductive element 120. The secure element 130 and the heat-transfer element 140 are disposed side-by-side on the conductive element 120. The lower surface 131 of the secure element 130 engages the upper surface 122 of the conductive element 120, and the lower surface 141 of the heat-transfer element 140 engages the upper surface 122 of the conductive element 120. Potting compound 150 is at least partially disposed over the stack of substrate 110, secure element 130, heat-transfer element 140 and conductive element 120, such that potting compound 150 engages one or more of the upper surface 112 of the substrate 110, the upper surface 122 of the conductive element 120, the upper surface 132 of the secure element 130, and the upper surface 142 of the heat-transfer element 140.

In one embodiment, the device 100 depicted in FIGS. 1A-B is devoid of a conductive element 120, and each of secure element 130 and heat-transfer element 140 are thus disposed on the substrate 110. It may also be possible to dispose the conductive element 120 on top of the secure element 130 and heat-transfer element 140 if such devices are mounted on the upper surface of the substrate 112. In such an arrangement, the lower surface of the conductive element 121 may be in direct contact with the upper surface of the secure element 132 and the upper surface of the heat-transfer element 142.

Figure 2A:
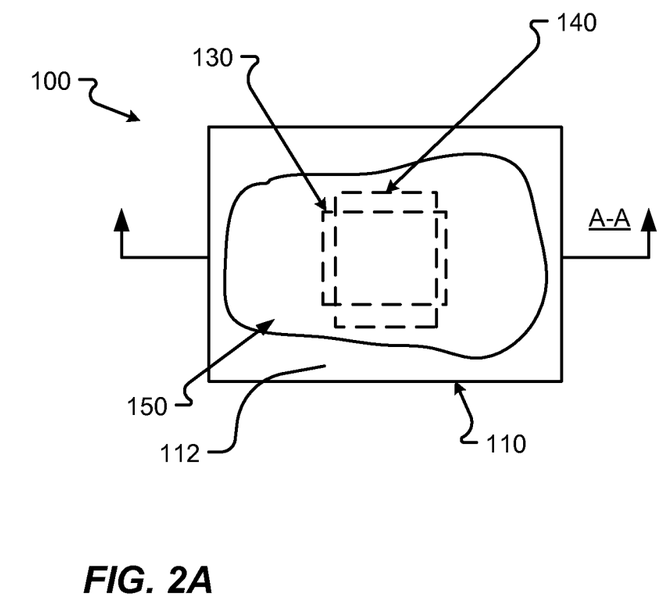
FIG. 2A is a top-view of a temperature-controlled integrated circuit in accordance with some embodiments of the present disclosure.
Figure 2B:
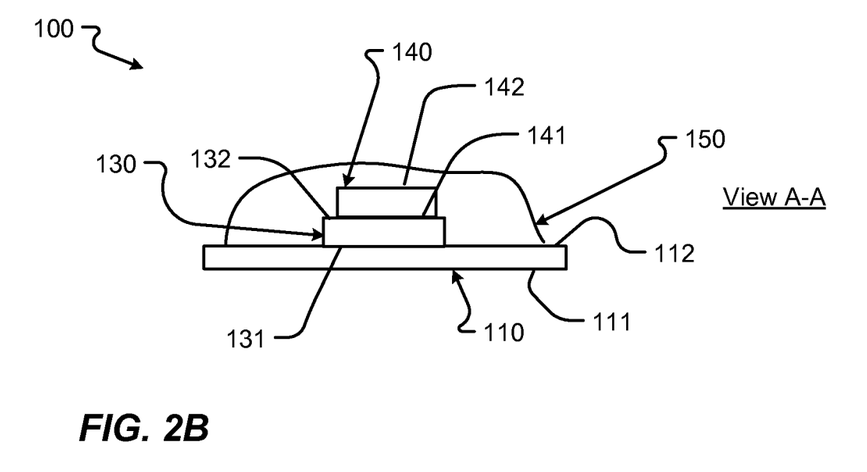
FIG. 2B is a cross-sectional side-view of a temperature-controlled integrated circuit in accordance with some embodiments of the present disclosure.

An alternative arrangement for the device 100 is depicted in FIGS. 2A-B. FIGS. 2A-B provide corresponding top and cross-sectional side views of the device 100. FIG. 2A is a top-view of the temperature-controlled integrated circuit device 100 and FIG. 2B is the corresponding cross-sectional side view along section line A-A.

In the alternate arrangement of FIGS. 2A-B, the device 100 is shown with heat-transfer element 140 and secure element 130 in a stacked arrangement, rather than the side-by-side arrangement of FIGS. 1A-B. Also, conductive element 120 is absent. Specifically, FIGS. 2A-B depict a temperature-controlled integrated circuit device 100 having a substrate 110, a secure element 130, a heat-transfer element 140, and potting compound 150. The substrate 110 has a lower surface 111 and upper surface 112. The secure element 130 has a lower surface 131 and upper surface 132, and the heat-transfer element 140 has a lower surface 141 and upper surface 142. The secure element 130 disposed on the substrate 110 such that the upper surface 112 of the substrate 110 engages the lower surface 131 of the secure element 130. The heat-transfer element 140 is disposed on top of the secure element 130, such that the lower surface 141 of the heat-transfer element 140 engages the upper surface 132 of the secure element 130. Potting compound 120 is disposed at least partially over the stack of substrate 110, secure element 130, and heat-transfer element 140, such that potting compound 150 engages one or more of the upper surface 112 of the substrate 110, the upper surface 132 of the secure element 130, and the upper surface 142 of the heat-transfer element 140.

In one embodiment, the device 100 depicted in FIGS. 2A-B has a conductive element 120 positioned between the secure element 130 and the substrate 110.

The substrate 110 of the device 100 can be constructed of a flexible, rigid or semi-rigid material. In one embodiment, the aforementioned elements of the device 100 are constructed of a plastic material or plastic composite. For example, the material may comprise polyethylene terephthalate (PET), polyethylene terephthalate glycol (PET G), crystalline PET (PET-C) i.e. a biaxially stretched polyethylene terephthalate. The substrate may be a printed circuit board (PCB) and/or any material known to one skilled in the art for use as a PCB or a backing plane for an integrated circuit.

The secure element 130 may be configured to perform secure data processing. The secure element 130 may be a secure access module (SAM) and/or a secure embedded element (SEM) and/or a subscriber identity module (SIM). As used herein a secure element refers to any certified tamper-resistant platform, capable of securely hosting applications and their confidential and cryptographic data in accordance with rules and security requirements set forth by a trusted authority. Examples of secure elements include Universal Integrated Circuit Cards (UICCs), embedded secure elements, and removable secure elements. More specific examples of removable secure elements include SAMs, micro Secure Digital (SD) cards, miniSD cards, SIM cards, and the like.

The heat-transfer element 140 may, in some embodiments, be a resistor or collection of resistors. The surface mount resistor is preferably between 2 and 100 ohms, more preferably between 5 and 80 ohms, and most preferably between 10 and 50 ohms. The heat-transfer element 140 may be an axial leaded resistor or any surface mount device (SMD) capable of generating heat.

The device 100 may be configured to operate in an environment of an access control reader.

The conductive element 120 may be made of a material consisting of copper, aluminum, titanium, tungsten, silicon carbide, a conductive epoxy, a conductive polymer, a metal and any material known to one skilled in the art to act as a conductive element. In one embodiment, the conductive element 120 is a plate. Additional disclosure regarding conductive plates may be found in U.S. Pat. Nos. 5,089,876; 5,396,403; and 6,330,145, each of which are incorporated by reference in their entireties.

Potting compound 150 may be disposed substantially over one or more of the secure element 130 and heat-transfer element 140, where the phrase "substantially over" is understood to mean to cover no less than 50 percent of the compared surface area, e.g. to cover no less than 50 percent of the surface area of the upper surface 142 of the heat-transfer element 140. The potting compound 150 may be any compound known to one skilled in the art as used in integrated circuits. Most preferable the compound is any compound that acts as a thermally-conductive compound.

Any one or more of the secure element 130, heat-transfer element 140, and conductive element 120 may be disposed and/or adhered to one another and/or the substrate 110 by any of several methods know to those skilled in the art, to include standard methods of soldering surface mounted components (SMCs) to PCBs. U.S. 2004/007324 and WO 2009/1063058 disclose common adhesion methods, both of which are hereby incorporated herein by reference in their entireties. It should be appreciated that the above-mentioned documents are non-limiting examples of the types of methods that may be employed. Other known or yet-to-be-developed mechanisms are also considered to be within the scope of the present disclosure.

In one embodiment, the device 100 depicted in FIGS. 1A-B or FIGS. 2A-B is devoid of potting compound 150.

Although in FIGS. 1A-B and FIGS. 2A-B the potting compound 150 is shown as a continuous, single structure, in other embodiments the potting compound is a plurality of structures and/or not a continuous structure.

Although embodiments of the present disclosure generally describe the manufacturing process to involve attaching, disposing and/or positioning the secure element 130, heat-transfer element 140, conductive element 120 and potting compound 150 to the substrate 110, it should be appreciated that embodiments of the present disclosure also contemplate attaching, disposing and/or positioning the secure element 130 and heat-transfer element 140 to the substrate 110 without one or both of attaching, disposing and/or positioning the conductive element 120 and potting compound 150 to the substrate 110.

In one embodiment, the nominal operating range of the secure element 130 is between about −35 degree Celsius and +65 degree Celsius. In another embodiment, the nominal operating range of the secure element 130 is above 0 degree Celsius.

Figure 3:
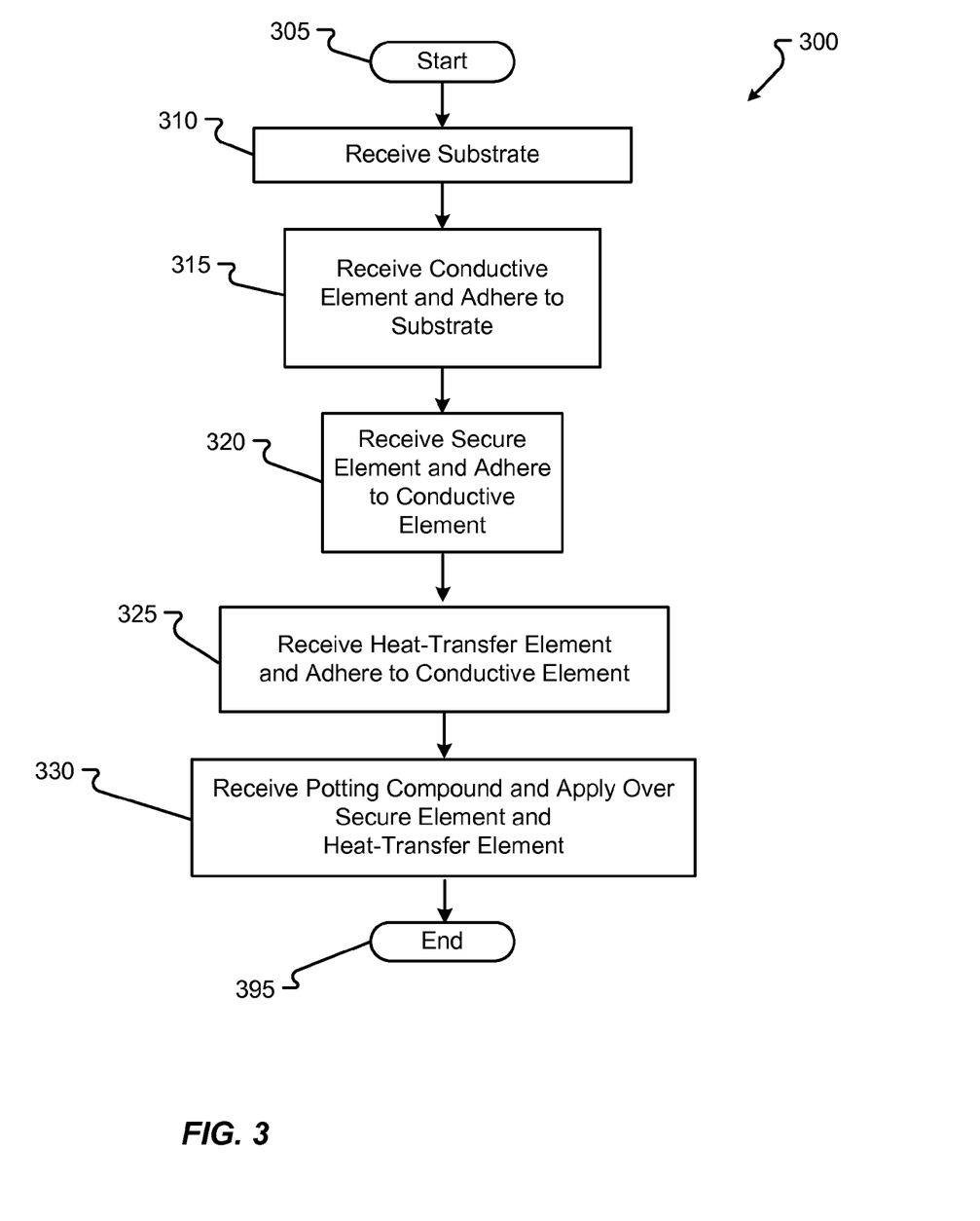
FIG. 3 is a flow-diagram representation of a method of manufacture of a temperature-controlled integrated circuit in accordance with at least some embodiments of the present disclosure.

An embodiment of a method of manufacture of a temperature-controlled integrated circuit device 100 as depicted in FIGS. 1A-B, in accordance with at least some embodiments of the present disclosure, is depicted in FIG. 3. FIG. 3 is a flow diagram of the process.

A general order for the steps of the method 300 of a method of manufacture is shown in FIG. 3. The method 300 starts with a start operation 305 and ends with an end operation 395. The method 300 can include more or fewer steps or can arrange the order of the steps differently than those shown in FIG. 3.

Hereinafter, the method 300 shall be explained with reference to the systems, components, elements, etc. described in conjunction with FIGS. 1-2. The method 300 produces an embodiment of the temperature-controlled integrated circuit device 100 of the type shown in FIGS. 1A-B.

After beginning the method with start operation 305, a sheet of substrate 110 is received, as depicted in step 310. The sheet 110 would typically be sized to allow a plurality of IC devices 100 to be manufactured, although the sheet 110 could also be configured to produce one device 100 at a time.

In step 315, the conductive element 120 is received and adhered to the substrate 110. Any of several methods know to those skilled in the art for adhering electrical and/or IC components to a substrate may be used, to include various glues and welding technologies.

In step 320, the secure element 130 is received and positioned on the conductive element 120. The secure element 130 is positioned on the conductive element 120 such that sufficient space is provided on the conductive element 120 to allow the subsequent positioning of the heat-transfer element on the conductive element 120. The secure element 130 is adhered to the conductive element 120.

In step 325, the heat-transfer element 140 is received and positioned on the conductive element 120. The heat-transfer element 140 is positioned on the conductive element 120 relative to the position of the secure element 130 so as to allow the heat-transfer element 140 to transfer heat to the secure element 130. The heat-transfer element 140 is adhered to the conductive element 120.

In step 330, potting compound 330 is received and applied over at least a portion of the upper surface 132 of the secure element 130 and the upper surface 142 of the heat-transfer element 140, and at least a portion of the upper surface 112 of the substrate 110. The potting compound may be applied so as to create a single, continuous structure as depicted in FIGS. 1A-B or, alternatively, as a set of multiple structures.

The process ends at step 395 in producing one or more temperature-controlled integrated circuit devices 100.

Figure 4:
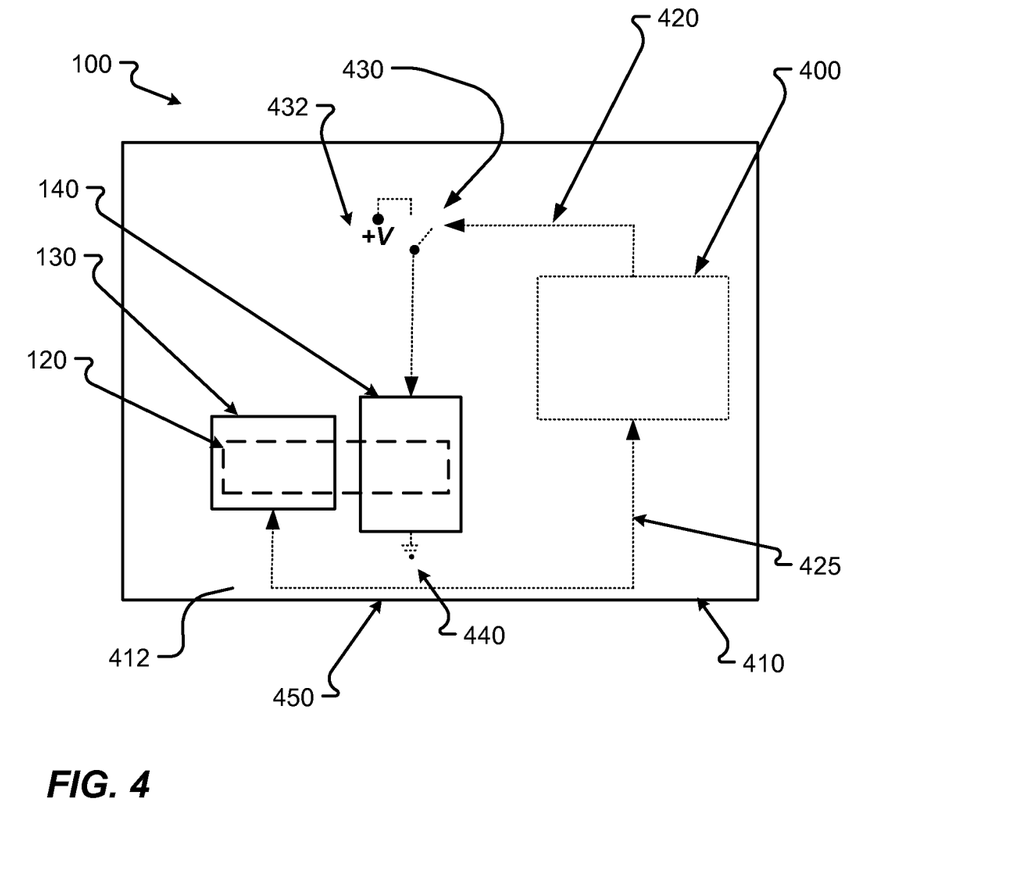
FIG. 4 is a top-view of a temperature-controlled integrated circuit in an access control reader environment.

FIG. 4 is a top-view of a temperature-controlled integrated circuit device 100 in an access control reader environment. The device 100 is depicted in the embodiment of FIGS. 1A-B, except that the potting compound 150 has been removed for clarity. Additional components of an access control reader are not shown in FIG. 4.

FIG. 4 depicts a temperature-controlled integrated circuit device 100 having a substrate 410, a secure element 130, a heat-transfer element 140 and a conductive element 120. The substrate 110 has an upper surface 412. The conductive element 120 is disposed on the substrate 410, such that the upper surface 412 of the substrate 110 engages the lower surface of the conductive element 120. The secure element 130 and the heat-transfer element 140 are disposed side-by-side on the conductive element 120. The lower surface of the secure element 130 engages the upper surface of the conductive element 120, and the lower surface of the heat-transfer element 140 engages the upper surface of the conductive element 120. Potting compound is disposed at least partially over one or more of the stack of secure element 130, heat-transfer element 140 and conductive element 120 as well as another other components on the substrate 410 (e.g., general purpose microprocessor 400).

A general purpose microprocessor 400 is in communication 425 with the secure element 130 and is in communication 420, via switch 430 to voltage source 432, with heat-transfer element 140. Heat-transfer element 140 also engages ground 440. The general purpose microprocessor 400, among other things, controls operations of the secure element 130, such as secure data processing. Communications 425 may include input/output, clock, reset, power, and ground. If the secure element 130 were to stop functioning, for example due to encountering an operating temperature outside of its nominal operating temperature range, communications 425 with the general purpose microprocessor 400 would stop or be interrupted; such a state would be recognized by the general purpose microprocessor 400 and trigger the microprocessor 400 to activate the heat-transfer element 140 by connecting it to voltage source 432 via actuation of the switch 430. The general purpose microprocessor 400 may engage the power source 432 through switch 430 so as to provide power to heat-transfer element 140. A complete circuit running between general purpose microprocessor 400 to voltage source 432 to surface mount resistor heat-generating element 140 would generate heat. In one embodiment, the switch 430 is a transistor. In one embodiment, the general purpose processor 400 acts as the heat-generating element 140.

In one embodiment, the voltage source 432 is between 1-30 volts, in a preferred embodiment the voltage source 432 is between 2-25 volts, and in a most preferred embodiment, the voltage source 432 is between 5-16 volts.

Figure 5:
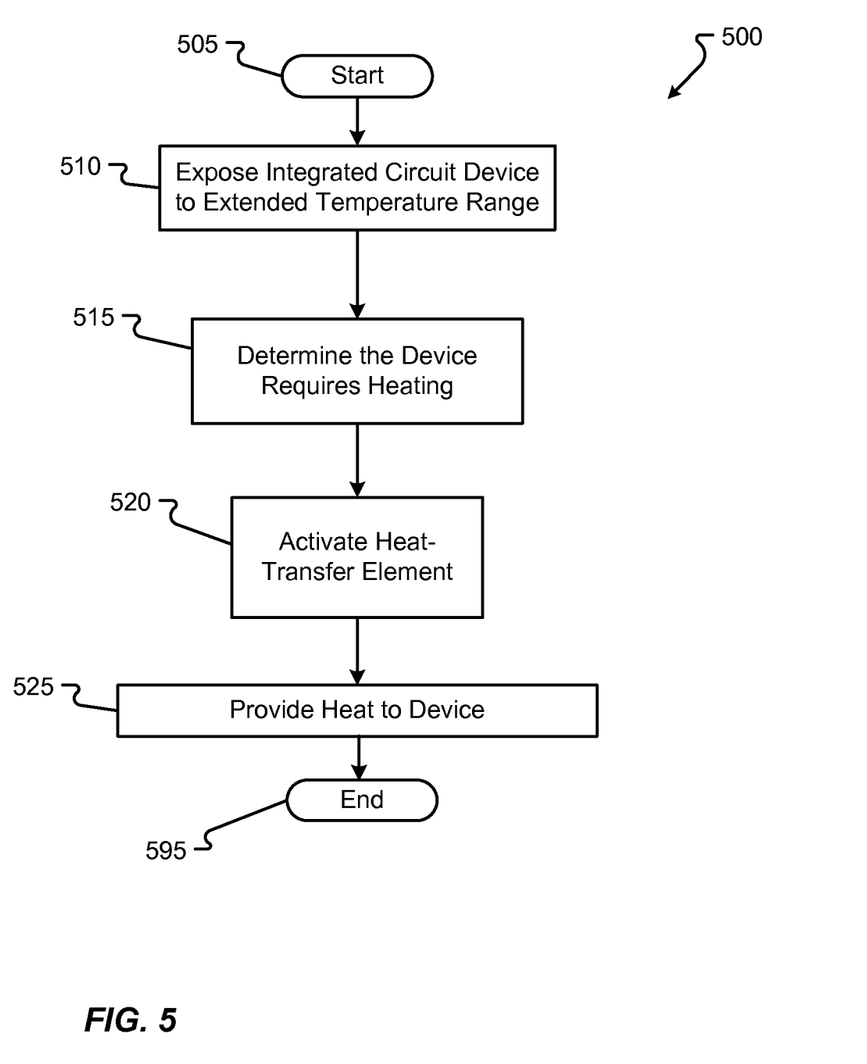
FIG. 5 is a flow diagram of an embodiment of a method of use of a temperature-controlled integrated circuit in accordance with at least some embodiments of the present disclosure.

An embodiment of a method of use of a temperature-controlled integrated circuit device 100 as depicted in FIGS. 1-2 and 4, in accordance with at least some embodiments of the present disclosure, is depicted in FIG. 5. FIG. 5 is a flow diagram of the process.

A general order for the steps of the method 500 of a method of use is shown in FIG. 5. The method 500 starts with a start operation 505 and ends with an end operation 595. The method 500 can include more or fewer steps or can arrange the order of the steps differently than those shown in FIG. 5.

Hereinafter, the method 500 shall be explained with reference to the systems, components, elements, etc. described in conjunction with FIGS. 1-2 and 4. The method 500 produces an embodiment of the temperature-controlled integrated circuit device 100 that operates in an extended temperature range.

After beginning the method with start operation 505, the temperature-controlled integrated circuit device 100 is exposed to an extended temperature range. That is, the device 100, which is configured to operate within a nominal operating temperature range, is exposed to a temperature below the lowest temperature of that nominal temperature range. For example, a device 100 with a lowest nominal operating temperature of 0 degree Celsius is exposed to a temperature of −10 degree Celsius.

In step 515, the device 100 determines that heating is required (so as to allow the device 100 to operate). The device 100 may determine heating is required in any of several ways, to include receiving an input from a sensor that senses at least one of an atmospheric temperature adjacent the system is below the nominal lowest operating temperature, a temperature is measured on the device itself that similarly indicates that the system is below the nominal lowest operating temperature, and/or a state of the communication between the secure element 130 and a general purpose processor 500 (as depicted in FIG. 4). However, one state of the communication between the secure element 130 and the general purpose processor 500 that could trigger the device 100 to apply heat is a no-op state, i.e. a state of no operations, or a lack or degradation of communications between the secure element 130 and the general purpose processor 500. If, for example, the secure element 130 were to stop functioning, for example due to encountering an operating temperature outside of its nominal operating temperature range, communications 425 with the general purpose microprocessor 400 would stop or be interrupted; such a state would be recognized by the general purpose microprocessor 400.

In step 520, the heat-generating element is activated. For example, as shown in FIG. 4, the general purpose microprocessor 400 may engage a power source 432 through switch 430 so as to provide power to heat-generating element 140.

In step 525, heat is applied to the device 100. A complete circuit running between general purpose microprocessor 400 to voltage source 432 to surface mount resistor heat-generating element 140 would generate heat given current running through the resistor. The process ends at step 595 such that the temperature-controlled integrated circuit device 100 operates in an extended temperature range.

While the pictorial representations and flowcharts have been discussed and illustrated in relation to a particular sequence of events, it should be appreciated that changes, additions, and omissions to this sequence can occur without materially affecting the operation of the disclosed embodiments, configuration, and aspects.

The present disclosure, in various aspects, embodiments, and/or configurations, includes components, methods, processes, systems and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A temperature-controlled integrated circuit device, comprising:
   a substrate having an upper surface;
   a secure element positioned on the substrate upper surface, the secure element configured to perform secure data processing within a nominal operating temperature range;
   a heat-transfer element positioned on the substrate upper surface, the heat-transfer element in thermal communication with the secure element and configured to transfer heat to the secure element; and
   a potting compound disposed on the substrate upper surface, the potting compound in communication with the secure element and the heat-transfer element, the potting compound substantially covering at least one of the secure element and the heat-transfer element;
   wherein the heat-transfer element enables the thermal communication between the secure element and the heat-transfer element by thermal conduction, thereby allowing the secure element to operate in an extended temperature range beyond the nominal operating temperature range; and
   wherein the heat-transfer element and the secure element are in surface contact.

2. The device of claim 1, further comprising a conductive element disposed on the substrate upper surface, the conductive element enabling the thermal communication between the secure element and the heat-transfer element.

3. The device of claim 2, wherein the material of the conductive element is selected from the group consisting of copper, aluminum, titanium, tungsten, silicon carbide, a conductive epoxy, a conductive polymer and a metal.

4. The device of claim 2, wherein the heat-transfer element comprises a surface mount resistor.

5. The device of claim 2, further comprising a general purpose processor in communication with the secure element, wherein the heat-transfer element comprises a surface mount resistor and wherein the heat-transfer element is configured to generate heat in response to at least one of an atmospheric temperature adjacent the device, a temperature measured on the device and a state of the communication between the secure element and the general purpose processor.

6. The device of claim 2, wherein the device is configured to operate as an access control reader.

7. The device of claim 2, wherein the extended temperature range comprises a temperature at or below 0 degrees Celsius.

8. The device of claim 1, further comprising a general purpose processor in communication with the secure element, wherein the heat-transfer element comprises a surface mount resistor and wherein the heat-transfer element is configured to generate heat in response to at least one of an atmospheric temperature adjacent the device, a temperature measured on the device and a state of the communication between the secure element and the general purpose processor.

9. The device of claim 1, wherein the heat-transfer element comprises a surface mount resistor.

10. The device of claim 9, further comprising a general purpose processor in communication with the secure element, wherein the heat-transfer element is configured to generate heat in response to at least one of an atmospheric temperature adjacent the device, a temperature measured on the device and a state of the communication between the secure element and the general purpose processor.

11. A temperature-controlled integrated circuit system comprising a conductive element mounted on a substrate and which contains a secure element and a heat-transfer element disposed thereof, the secure element configured to perform secure data processing within a nominal operating temperature range, the conductive element providing thermal conduction between the heat-transfer element and the secure element; a potting compound substantially and completely disposed over at least one of the heat-transfer element and the secure element; and a general purpose processor in communication with the secure element; wherein the heat-transfer element comprises a surface mount resistor; wherein the heat-transfer element is configured to generate heat in response to at least one of an atmospheric temperature adjacent the device, a temperature measured on the device and a state of the communication between the secure element and the general purpose processor; wherein the thermal conduction between the heat-transfer element and the secure element allows the secure element to operate in an extended temperature range beyond the nominal operating temperature range; wherein the system is configured to operate in an access control reader environment; and wherein the conductive element and the secure element are in direct physical contact by way of a shared surface.

12. A method for temperature control of an integrated circuit system, comprising the steps of:
   exposing a temperature-controlled integrated circuit system to an extended temperature range comprising a temperature at or below 0 degrees Celsius, the integrated circuit system comprising a conductive element mounted on a substrate and which contains a secure element and a heat-transfer element disposed thereof, the secure element configured to perform secure data processing within a nominal operating temperature range, the conductive element providing thermal communication between the heat-transfer element and the secure element, a potting compound disposed substantially over at least one of the heat-transfer element and the secure element, wherein the thermal communication between the heat-transfer element and the secure element is thermal conduction and allows the secure element to operate in an extended temperature range beyond the nominal operating temperature range;

determining that the integrated circuit system requires heating;

activating a heat-transfer element; and providing heat to at least a portion of the integrated circuit system to allow the integrated circuit system to operate in the extended temperature range beyond the nominal operating temperature range, wherein the step of providing heat to at least a portion of the integrated circuit system is enabled by the conductive element, the conductive element enabling the thermal communication between the secure element and the heat-transfer element disposed thereof; and wherein the conductive element and the secure element are in direct physical contact.

13. The method of claim 12, the integrated circuit system further comprising a general purpose processor in communication with the secure element, wherein the step of determining that the integrated circuit system requires heating comprises receiving an input from a sensor that senses at least one of an atmospheric temperature adjacent the system, a temperature measured on the system and a state of the communication between the secure element and the general purpose processor.

\* \* \* \* \*